United States Patent
Zheng

(10) Patent No.: US 10,788,631 B2
(45) Date of Patent: Sep. 29, 2020

(54) OPTICAL MODULE

(71) Applicants: Hisense Broadband Multimedia Technologies Co., Ltd., Qingdao, Shandong (CN); Hisense Broadband Multimedia Technologies, Ltd., Tortola (VG)

(72) Inventor: Long Zheng, Shandong (CN)

(73) Assignees: Hisense Broadband Multimedia Technologies Co., Ltd., Qingdao, Shandong (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 15/857,942

(22) Filed: Dec. 29, 2017

(65) Prior Publication Data

US 2018/0295700 A1    Oct. 11, 2018

(30) Foreign Application Priority Data

Apr. 6, 2017 (CN) .......................... 2017 1 0220900
May 17, 2017 (CN) .......................... 2017 1 0365787
(Continued)

(51) Int. Cl.
*H05B 37/02* (2006.01)
*G02B 6/42* (2006.01)
(Continued)

(52) U.S. Cl.
CPC .......... *G02B 6/4206* (2013.01); *G02B 6/428* (2013.01); *G02B 6/4214* (2013.01);
(Continued)

(58) Field of Classification Search
CPC .. G02B 6/4274; G02B 6/4292; H05K 9/0058; H04B 10/40; H04B 10/503; F21V 29/508
See application file for complete search history.

(56) References Cited

U.S. PATENT DOCUMENTS

| 7,744,291 B2 * | 6/2010 | Dybsetter | H04B 10/40 385/92 |
| 8,583,395 B2 * | 11/2013 | Dybsetter | H04B 10/40 398/135 |

(Continued)

FOREIGN PATENT DOCUMENTS

| CN | 101930767 A | 12/2010 |
| CN | 106411416 A | 2/2017 |

OTHER PUBLICATIONS

Second Office Action received from the State Intellectual Property Office of People's Republic of China for Application No. 201710725586.1 dated Jul. 25, 2019 (with English translation) (12 pp.).

(Continued)

*Primary Examiner* — Daniel Petkovsek
(74) *Attorney, Agent, or Firm* — Brinks Gilson & Lione

(57) ABSTRACT

This disclosure relate to power control of an optical module. In one implementation, an optical module is disclosed. The optical module comprises a first edge connector pin, a microcontroller unit (MCU), and a power supply control unit disposed on a circuit board, wherein the first edge connector pin is configured to receive a control signal sent by a main-unit device during power up of the optical module; the MCU is electrically connected to the first edge connector pin and the power supply control unit, and is configured to read the control signal using the first edge connector pin, and when the control signal is a first-type control signal, send a corresponding type indication information to the power supply control unit; and the power supply control unit is configured to receive the type indication information sent by the MCU, and stop, according to the type indication information, supplying power.

9 Claims, 5 Drawing Sheets

(30) Foreign Application Priority Data

| | | |
|---|---|---|
| May 23, 2017 | (CN) | 2017 1 0370658 |
| Jul. 19, 2017 | (CN) | 2017 1 0592117 |
| Aug. 17, 2017 | (CN) | 2017 1 0706221 |
| Aug. 22, 2017 | (CN) | 2017 1 0725586 |
| Sep. 18, 2017 | (CN) | 2017 1 0842912 |
| Oct. 10, 2017 | (CN) | 2017 1 0934006 |

(51) Int. Cl.

| | |
|---|---|
| H04B 10/00 | (2013.01) |
| H04B 10/80 | (2013.01) |
| H05B 47/10 | (2020.01) |
| F21V 29/504 | (2015.01) |
| F21V 29/508 | (2015.01) |
| F21V 29/83 | (2015.01) |
| F21V 23/00 | (2015.01) |
| H04B 10/40 | (2013.01) |
| H04B 10/50 | (2013.01) |
| H04B 10/85 | (2013.01) |
| H04B 15/02 | (2006.01) |
| H05K 9/00 | (2006.01) |

(52) U.S. Cl.
CPC ......... *G02B 6/4246* (2013.01); *G02B 6/4251* (2013.01); *G02B 6/4256* (2013.01); *G02B 6/4274* (2013.01); *G02B 6/4283* (2013.01); *G02B 6/4292* (2013.01); *F21V 23/005* (2013.01); *F21V 29/504* (2015.01); *F21V 29/508* (2015.01); *F21V 29/83* (2015.01); *H04B 10/00* (2013.01); *H04B 10/40* (2013.01); *H04B 10/503* (2013.01); *H04B 10/808* (2013.01); *H04B 10/85* (2013.01); *H04B 15/02* (2013.01); *H05B 47/10* (2020.01); *H05K 9/0058* (2013.01)

(56) References Cited

U.S. PATENT DOCUMENTS

| | | | | |
|---|---|---|---|---|
| 9,258,063 | B1* | 2/2016 | Oomori | H04B 10/503 |
| 2003/0053762 | A1* | 3/2003 | Cheng | G02B 6/4201 |
| | | | | 385/88 |
| 2012/0288279 | A1* | 11/2012 | Zhang | H04B 10/272 |
| | | | | 398/66 |
| 2013/0287392 | A1* | 10/2013 | Heimbuch | H04B 10/0799 |
| | | | | 398/38 |
| 2015/0254023 | A1* | 9/2015 | Davis | G06F 3/0679 |
| | | | | 710/301 |
| 2017/0060214 | A1* | 3/2017 | Yang | G06F 1/28 |
| 2018/0156990 | A1* | 6/2018 | Chou | G02B 6/423 |

OTHER PUBLICATIONS

Third Office Action received from the State Intellectual Property Office of People's Republic of China for Application No. 201710725586.1 dated Sep. 25, 2019 (no English translation) (3 pp.).

\* cited by examiner

OPTICAL MODULE

CROSS REFERENCES

The present application claims priority to Chinese Patent Application No. 201710934006.X filed on Oct. 10, 2017, Chinese Patent Application No. 201710842912.7 filed on Sep. 18, 2017, Chinese Patent Application No. 201710725586.1 filed on Aug. 22, 2017, Chinese Patent Application No. 201710706221.4 filed on Aug. 17, 2017, Chinese Patent Application No. 201710592117.7 filed on Jul. 19, 2017, Chinese Patent Application No. 201710370658.5 filed on May 23, 2017, Chinese Patent Application No. 201710365787.5 filed on May 17, 2017, and Chinese Patent Application No. 201710220900.0 filed on Apr. 6, 2017, which are herein incorporated by reference in their entireties.

The present application is relevant to the following four (4) U.S. patent applications, filed concurrently with the present application, the entireties of which are hereby incorporated by reference: U.S. patent application Ser. No. 15/857,855, entitled "Optical Module," filed Dec. 29, 2017; U.S. patent application Ser. No. 15/857,884, entitled "Optical Module," filed Dec. 29, 2017; U.S. patent application Ser. No. 15/857,987, entitled "Optical Module," filed Dec. 29, 2017; and U.S. patent application Ser. No. 15/857,958, entitled "Optical Module," filed Dec. 29, 2017.

BACKGROUND

Technical Field

The present disclosure relate to the technical field of optical fiber communication, and in particular, to an optical module and a method for controlling an optical module.

Related Art

Optical module technologies have been developed rapidly in recent years. The communications bit rates supported by optical modules continue to grow from the current mainstream 10G, 16G, 28G, 50G, 100G, and 200G to imminent 400G (G is a shorthand for gigabit per second). Consequently, power consumption of optical modules during operation keeps growing.

In current technologies, when an optical module having a high-power consumption is inserted into a main-unit device, there is strong impact on a power supply of the main-unit device. Overloading or burning of the power supply of the main-unit device may occur.

SUMMARY

The present disclosure relates power control of an optical module. In one implementation, an optical module is disclosed. The optical module comprises a first edge connector pin, a microcontroller unit (MCU), and a power supply control unit disposed on a circuit board, wherein the first edge connector pin is configured to receive a control signal sent by a main-unit device during power up of the optical module; the MCU is electrically connected to the first edge connector pin and the power supply control unit, and is configured to read the control signal using the first edge connector pin, and when the control signal is a first-type control signal, send a corresponding type indication information to the power supply control unit; and the power supply control unit is configured to receive the type indication information sent by the MCU, and stop, according to the type indication information, supplying power.

In another implementation, a method for controlling an optical module including a power supply control unit is disclosed. The method comprises receiving a control signal sent by a main-unit device during power up of the optical module; determining whether the control signal is a first-type control signal; and when the control signal is the first-type control signal, instructing the power supply control unit to stop supplying power.

In another implementation, a method for controlling an optical module by a main-unit device is disclosed. The method may be applied to an optical module comprising a power supply control unit. The method comprises detecting an electrical load of the main-unit device before the optical module is powered up; determining whether the electrical load is greater than a preset load value; when the electrical load is greater than the preset load value, sending a first-type control signal to the optical module during power up of the optical module, so that the optical module instructs, according to the first-type control signal, the power supply control unit to stop supplying power; and when the electrical load is not greater than the preset load value, sending a second-type control signal to the optical module during power up of the optical module, so that the optical module instructs, according to the second-type control signal, the power supply control unit to supply power normally.

BRIEF DESCRIPTION OF THE DRAWINGS

To illustrate more effectively the technical solutions and implementations of the present disclosure, the accompanying drawings are briefly described below.

DETAILED DESCRIPTION

To make the objectives, technical solutions, and beneficial effects of the present disclosure more comprehensible, various implementations are further described in detail below with reference to the accompanying drawings. It should be understood that the implementations described herein are merely examples that do not limit the scope of this disclosure.

Figure 1:
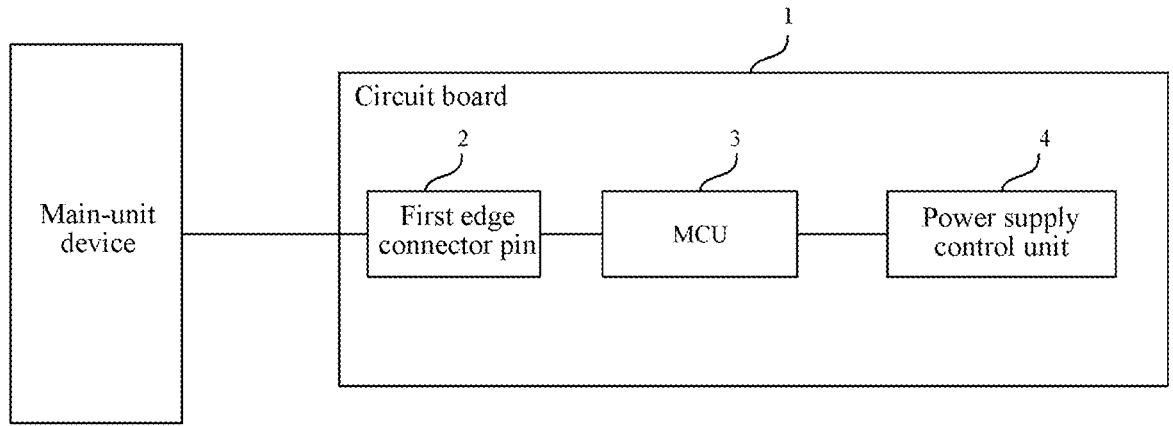
FIG. 1 is a schematic diagram of an exemplary optical module in communication with a main-unit device.

FIG. 1 shows an exemplary optical module. The optical module includes a first edge connector pin 2, a microcontroller unit (MCU) 3, and a power supply control unit 4 disposed on a circuit board 1.

The first edge connector pin 2 is configured to receive a control signal sent by a main-unit device during power up of the optical module.

The MCU 3 is electrically connected to the first edge connector pin 2 and the power supply control unit 4, and is configured to read the control signal using the first edge connector pin 2, and when the control signal is a first-type control signal, send a type indication information to the power supply control unit 4.

The power supply control unit 4 is configured to receive the type indication information sent by the MCU 3, and control supply of power to the optical module, according to the type indication information. When the type indication information is the first-type, the power supply control unit 4 stops supplying power.

The MCU 3 may further be configured to when the control signal is a second-type control signal, skip sending the type indication information to the power supply control unit 4, so that the power supply control unit 4 supplies power normally.

It should be noted that the first edge connector pin 2 may be any pin of the edge connector of the optical module, provided that it is defined in advance that a particular pin is configured to receive the control signal sent by the main-unit device during power up of the optical module.

Figure 2:
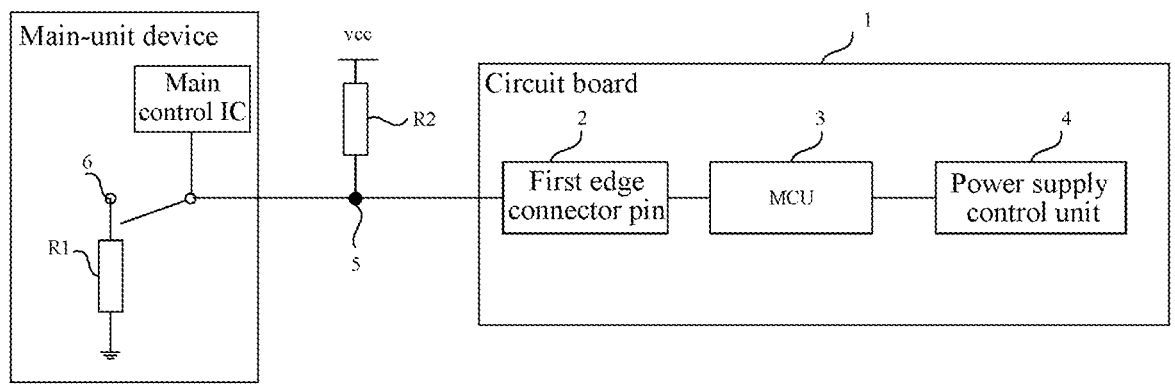
FIG. 2 is another schematic diagram of an exemplary optical module in communication with a main-unit device.

In a specific implementation, the main-unit device and the optical module may collaborate to pre-determine the use of a low electric level in the control signal to represent the first-type control signal and a high electric level to represent the second-type control signal. Refer to FIG. 2 for a specific implementation process.

As shown in FIG. 2, the main-unit device may include a main control integrated circuit (IC), a resistor R1, and a switch 6. A second resistor R2 are connected to the resistor R1 in series via the switch 6. The resistor R1 is further connected to ground. The resistor R2 is further connected to a power supply terminal Vcc. The main control IC is configured to control the switch 6 to be closed or open.

When the main control IC controls the switch 6 to be closed, the main-unit device may send a low electric level signal to the optical module during power up of the optical module. When the main control IC controls the switch 6 to be open, the main-unit device may send the high electric level signal to the optical module during power up of the optical module.

Specifically, when the main control IC controls the switch 6 to be closed, the first edge connector pin 2 of the optical module may read a voltage value V1 at a point 5 of FIG. 2. When the main control IC controls the switch 6 to be opened, the first edge connector pin 2 of the optical module may read a voltage value V2 at the point 5. When the main control IC controls the switch 6 to be closed, R1 diverts a partial voltage at the point 5. Therefore, V1<V2. In this way, the first edge connector pin 2 may determine, by using the voltage at the point 5, whether the control signal sent by the main-unit device is the first-type control signal or the second-type control signal.

It should be noted that the resistor R2 and the power supply Vcc may be disposed inside the first edge connector pin 2 of the optical module, or may be disposed near the first edge connector pin of the optical module 2, or may further be disposed inside the main-unit device.

Figure 3:
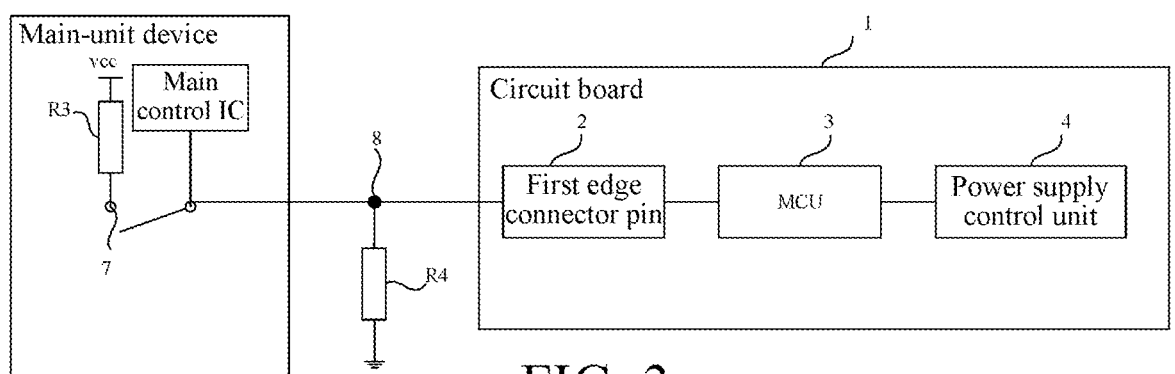
FIG. 3 is another schematic diagram of an exemplary optical module in communication with a main-unit device.

In a specific implementation, the main-unit device and the optical module may further collaborate to pre-determine the use of a high electric level to represent the first-type control signal and a low electric level to represent the second-type control signal. Refer to FIG. 3 for such a specific implementation process.

As shown in FIG. 3, the main-unit device may include the main control integrated circuit (IC), a resistor R3, and a switch 7. A second resistor R4 are connected to the resistor R3 in series via the switch 6. The resistor R3 is connected to the power supply terminal Vcc. The resistor R4 is grounded, and the main control IC is configured to control the switch 7 to be closed or open.

When the main control IC controls the switch 7 to be closed, the main-unit device may send a high electric level signal to the optical module during power up of the optical module. When the main control IC controls the switch 7 to be open, the main-unit device may send a low electric level signal to the optical module during power up of the optical module.

Specifically, when the main control IC controls the switch 7 to be closed, the first edge connector pin 2 of the optical module may read a voltage value V3 at the point 8. When the main control IC controls the switch 7 to be open, the first edge connector pin 2 of the optical module may read a voltage value V4 at the point 8. When the main control IC controls the switch 7 to be open, R4 is grounded. Therefore, V3>V4. In this way, the first edge connector pin may determine, by using the voltage at the point 8, whether the control signal sent by the main-unit device is the first-type control signal or the second-type control signal.

It should be noted that the resistor R4 may be disposed inside the first edge connector pin 2 of the optical module, or may be disposed near the first edge connector pin 2 of the optical module, or may further be disposed inside the main-unit device.

Figure 4:
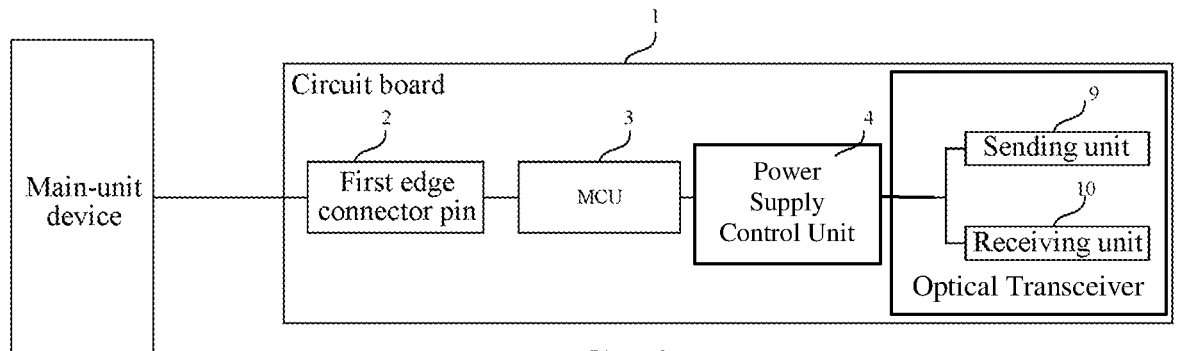
FIG. 4 is another schematic diagram of an exemplary optical module in communication with a main-unit device.

In one implementation, to minimize the impact on the power supply of the main-unit device during power up of the optical module, after receiving the type indication information, the power supply control unit may stop supplying power to only an optical transceiver inside the optical module containing a sending unit 9 and/or a receiving unit 10, as shown in FIG. 4.

The sending unit 9 may include, but is not limited to, a laser driver, and a laser. The receiving unit 10 may include, but is not limited to, a limiting amplifier (LA), and a trans-impedance amplifier (TIA).

Further, to minimize the impact on the power supply of the main-unit device during power up of the optical module, after receiving the type indication information, the power supply control unit may further stop supplying power all chip units inside the optical module, where the chip units include an IC chip or a non-IC chip.

It may be seen according to the foregoing implementations that the power supply control unit is added to the optical module. The first edge connector pin of the optical module may be configured to receive the control signal sent by the main-unit device during power up of the optical module. The MCU of the optical module may be configured to read the control signal by using the first edge connector pin, and when the control signal is the first-type control signal, instruct the power supply control unit to stop supplying power. During power up of the optical module, the control signal can be used to instruct the power supply control unit to stop supplying power, and therefore the impact by the optical module on a power supply of the main-unit device at the instant when the optical module is inserted in the main-unit device can be reduced.

Figure 5:
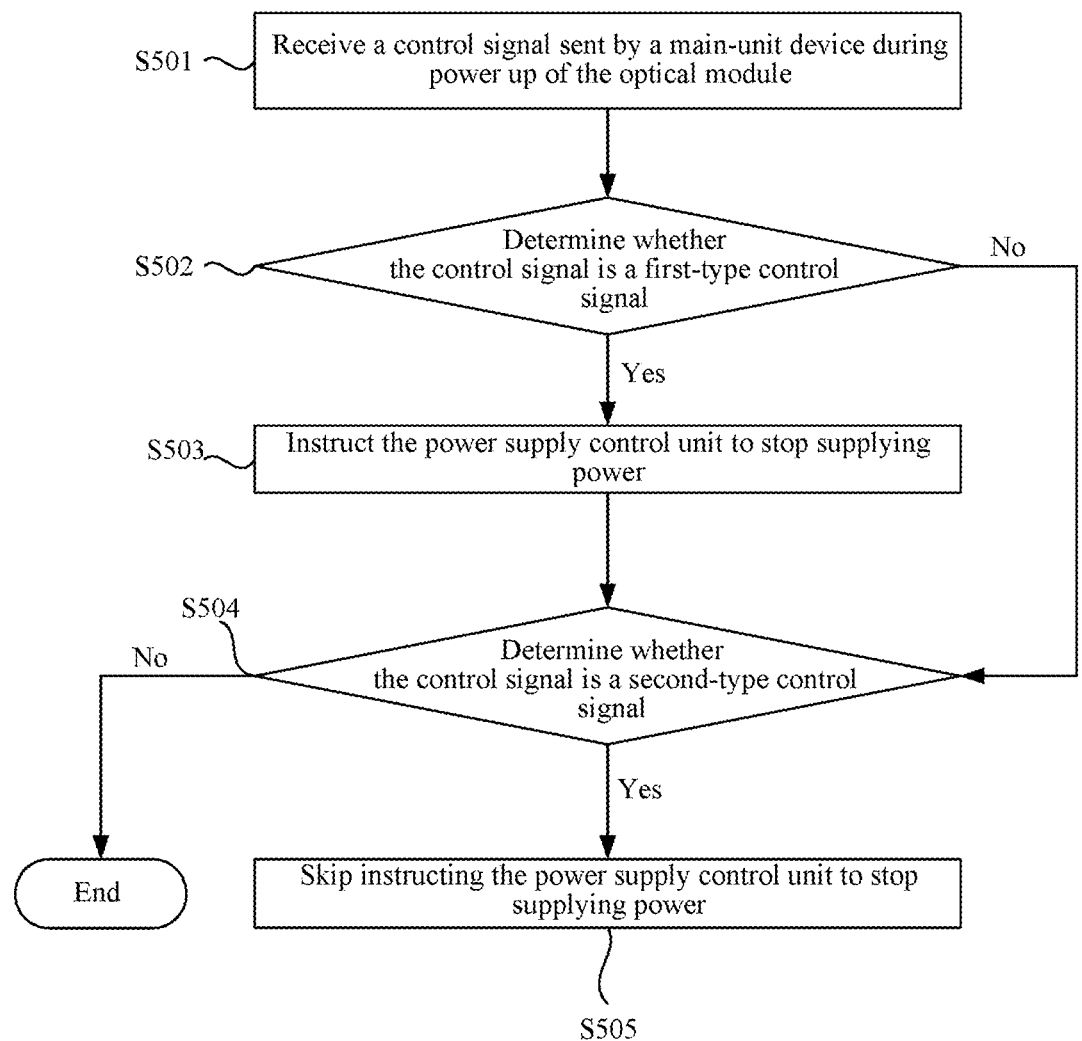
FIG. 5 is a flowchart of a method for controlling an optical module.

In one implementation, a method for controlling an optical module is provided. The method is applied to an optical module including a power supply control unit. As shown in FIG. 5, the method may include:

S501: Receive a control signal sent by a main-unit device during power up of the optical module.

S502: Determine whether the control signal is a first-type control signal, and if yes, the process turns to the step S503. Otherwise, the process turns to the step S504.

S503: Instruct the power supply control unit to stop supplying power.

Specifically, type indication information may be sent to the power supply control unit. The power supply control unit stops supplying power according to the type indication information.

S504: Determine whether the control signal is a second-type control signal, and if yes, the process turns to the step S505. Otherwise, the procedure ends.

S505: Skip instructing the power supply control unit to stop supplying power.

Specifically, type indication information used to instruct the power supply control unit to continue supplying power to the optical module may be sent to the power supply control unit, or no type indication information may be sent to the power supply control unit.

In one implementation, in step S503, when the power supply control unit is instructed to stop supplying power, to minimize the impact on the power supply of the main-unit device during power up of the optical module, the power supply control unit may be instructed to stop supplying power to only the sending unit inside the optical module.

In another implementation, in step S503, when the power supply control unit is instructed to stop supplying power, to minimize the impact on the power supply of the main-unit device during power up of the optical module, the power supply control unit may be instructed to stop supplying power to only the receiving unit inside the optical module.

In another implementation, in step S503, when the power supply control unit is instructed to stop supplying power, to minimize the impact on the power supply of the main-unit device during power up of the optical module, the power supply control unit may further be instructed to stop supplying power to both the sending unit and the receiving unit inside the optical module.

The sending unit may include, but is not limited to, a laser driver, and a laser. The receiving unit may include, but is not limited to, an LA, and a TIA.

Further, to minimize the impact on the power supply of the main-unit device during power up of the optical module, after receiving the type indication information, the power supply control unit may further stop supplying power to all chip units inside the optical module, where the chip units include an IC chip or a non-IC chip.

Figure 6:
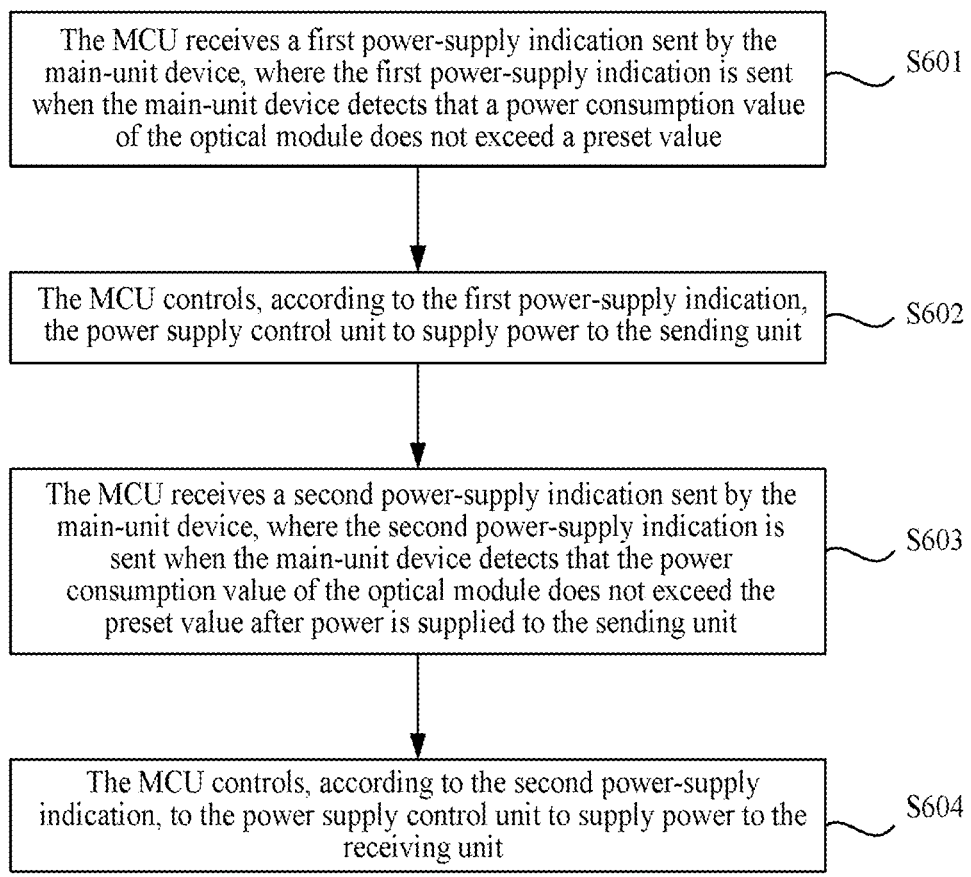
FIG. 6 is another flowchart of a method for controlling an optical module.

After the optical module is powered up, to ensure that the components inside the optical module can work normally, and at the same time to prevent power consumption of the optical module from becoming excessively high and from exerting negative impact on the power supply of the main-unit device, after instructing the power supply control unit to stop supplying power, the MCU may further execute the following method procedure as shown in FIG. 6.

S601: The MCU receives a first power-supply indication sent by the main-unit device, where the first power-supply indication is sent when the main-unit device detects that a power consumption value of the optical module does not exceed a preset power consumption value.

S602: The MCU controls, according to the first power-supply indication, the power supply control unit to supply power to the sending unit.

The sending unit may include, but is not limited to, a laser driver, and a laser.

S603: The MCU receives a second power-supply indication sent by the main-unit device, where the second power-supply indication is sent when the main-unit device detects that the power consumption value of the optical module does not exceed the preset power consumption value after power is supplied to the sending unit.

S604: The MCU controls, according to the second power-supply indication, the power supply control unit to supply power to the receiving unit.

The receiving unit may include, but is not limited to, an LA, and a TIA.

Figure 7:
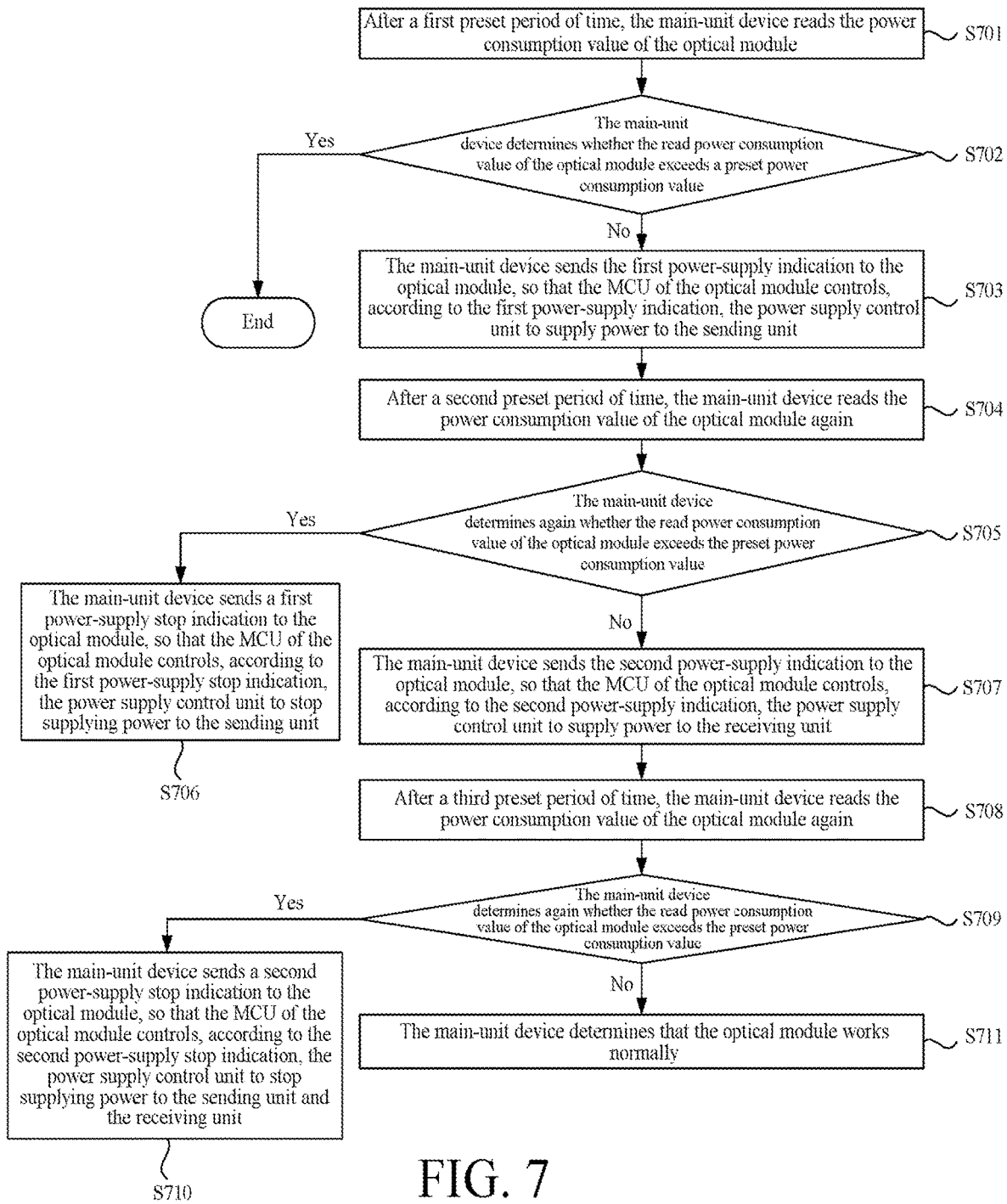
FIG. 7 is another flowchart of a method for controlling an optical module

Correspondingly, after the optical module is powered up, to ensure that the components inside the optical module can work normally, and at the same time to prevent power consumption of the optical module from becoming excessively high and from exerting negative impact on the power supply of the main-unit device, after the MCU instructs the power supply control unit to stop supplying power, the main-unit device may read the power consumption value of the optical module, and may correspondingly adjust a power supply mode of the optical module according to the power consumption value. Refer to FIG. 7 for details.

S701: After a first preset period of time, the main-unit device reads or measures the power consumption value of the optical module.

S702: The main-unit device determines whether the read or measured power consumption value of the optical module exceeds a preset power consumption value, and if yes, end the procedure, or otherwise, the process turns to the step S704.

For example, if the power consumption value of the optical module read by the main-unit device after the first preset period of time is 0.6 V (arbitrary unit), and the preset power consumption value of the main unit is 0.8 V, it is determined that the power consumption value of the optical module does not exceed the preset power consumption value.

S703: The main-unit device sends the first power-supply indication to the optical module, so that the MCU of the optical module controls, according to the first power-supply indication, the power supply control unit to supply power to the sending unit.

The sending unit may include, but is not limited to, a laser driver, and a laser.

S704: After a second preset period of time, the main-unit device reads the power consumption value of the optical module again.

S705: The main-unit device determines again whether the read power consumption value of the optical module exceeds the preset power consumption value, and if yes, the process turns to the step S706, or otherwise, the process turns to the step S707.

For example, if the power consumption value of the optical module read by the main-unit device after the second preset period of time is 0.85 V, and the preset power consumption value of the main unit is 0.8 V, it is determined that the power consumption value of the optical module exceeds the preset power consumption value. If the power consumption value of the optical module read by the main-unit device after the first preset period of time is 0.5 V, and the preset power consumption value of the main unit is 0.8 V, it is determined that the power consumption value of the optical module does not exceed the preset power consumption value.

S706: The main-unit device sends a first power-supply stop indication to the optical module, so that the MCU of the optical module controls, according to the first power-supply stop indication, the power supply control unit to stop supplying power to the sending unit.

S707: The main-unit device sends the second power-supply indication to the optical module, so that the MCU of the optical module controls, according to the second power-supply indication, the power supply control unit to supply power to the receiving unit.

The receiving unit may include, but is not limited to, an LA, and a TIA.

S708: After a third preset period of time, the main-unit device reads the power consumption value of the optical module again.

S709: The main-unit device determines again whether the read power consumption value of the optical module exceeds the preset power consumption value, and if yes, the process turns to the step S710, or otherwise, the process turns to the step S711.

For example, if the power consumption value of the optical module read by the main-unit device after the second preset period of time is 0.9 V, and the preset power consumption value of the main unit is 0.8 V, it is determined that the power consumption value of the optical module exceeds the preset power consumption value. If the power consumption value of the optical module read by the main-unit device after the first preset period of time is 0.4 V, and the preset power consumption value of the main unit is 0.8 V, it is determined that the power consumption value of the optical module does not exceed the preset power consumption value.

S710: The main-unit device sends a second power-supply stop indication to the optical module, so that the MCU of the optical module controls, according to the second power-supply stop indication, the power supply control unit to stop supplying power to the sending unit and the receiving unit.

S711: The main-unit device determines that the optical module works normally.

In a specific implementation, the main-unit device may read the power consumption value of the optical module by using an inter-integrated circuit (IIC) bus. Alternatively, the main-unit device may read the power consumption value of the optical module by using another edge connector pin.

Figure 8:
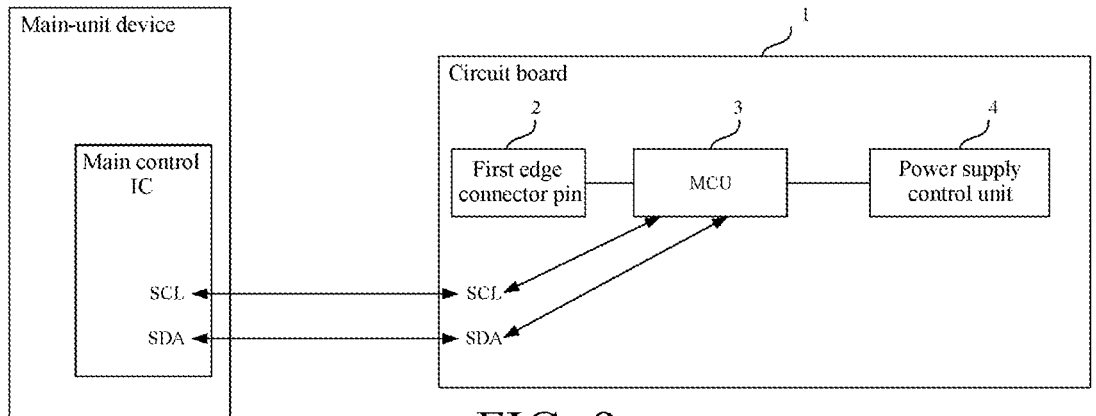
FIG. 8 is a schematic diagram showing communication of control signal between an optical module and a main-unit device.

FIG. 8 shows an implementation of the main-unit device reading the power consumption value of the optical module by using the IIC bus.

It may be seen from FIG. 8 that, the IIC bus includes two lines, that is, a clock line (serial clock line, SCL) and a bidirectional data line (serial data line, SDA). After the optical module is inserted in the main-unit device, the main-unit device communicates with the MCU of the optical module by using the SCL and the SDL of the main control IC, to deliver instructions and access data. For example, the main-unit device may communicate with the MCU of the optical module using the SCL and the SDL of the main control IC, to read the power consumption value of the optical module, and communicate with the MCU of the optical module using the SCL and the SDL of the main control IC, to send the first power-supply indication, the first power-supply stop indication, the second power-supply indication, and the second power-supply stop indication.

It should be noted that the foregoing first preset period of time, second preset period of time, and third preset period of time may have the same time length or different time lengths.

In addition, the main-unit device may periodically perform the method procedure shown in the foregoing FIG. 7.

It may be seen according to the foregoing implementations that, first, the control signal sent by the main-unit device is received during power up of the optical module, and when the control signal is the first-type control signal, the power supply control unit is instructed to stop supplying power. During power up of the optical module, the control signal can be used to instruct the power supply control unit to stop supplying power, and therefore the impact on a power supply of the main-unit device at the instant when the optical module is inserted in the main-unit device can be reduced or avoided.

Figure 9:
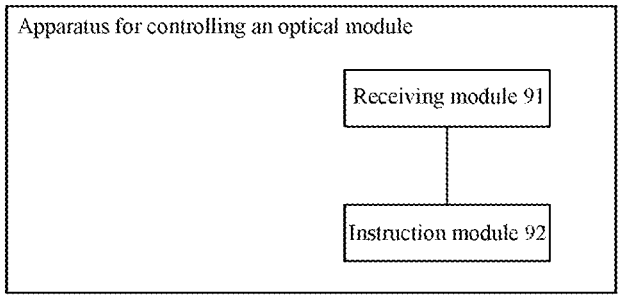
FIG. 9 is a schematic structural diagram of an apparatus for controlling an optical module.

Based on the same technical concept, an embodiment of the present disclosure further provides an apparatus for controlling an optical module, applied to an optical module including a power supply control unit. As shown in FIG. 9, the apparatus may include:

a receiving module 91, configured to receive a control signal sent by a main-unit device during power up of the optical module; and an instruction module 92, configured to: when the control signal is a first-type control signal, instruct the power supply control unit to stop supplying power.

Preferably, the instruction module 92 is specifically configured to instruct the power supply control unit to stop supplying power to a receiving unit and/or a sending unit of the optical module.

It may be seen according to the foregoing implementations that, first, the receiving module 91 may receive the control signal sent by the main-unit device during power up of the optical module, and when the control signal is the first-type control signal, may instruct the power supply control unit to stop supplying power. During power up of the optical module, the control signal can be used to instruct the power supply control unit to stop supplying power, and therefore the impact on the power supply of the main-unit device at the instant when the optical module is inserted in the main-unit device can be reduced or avoided.

Figure 10:
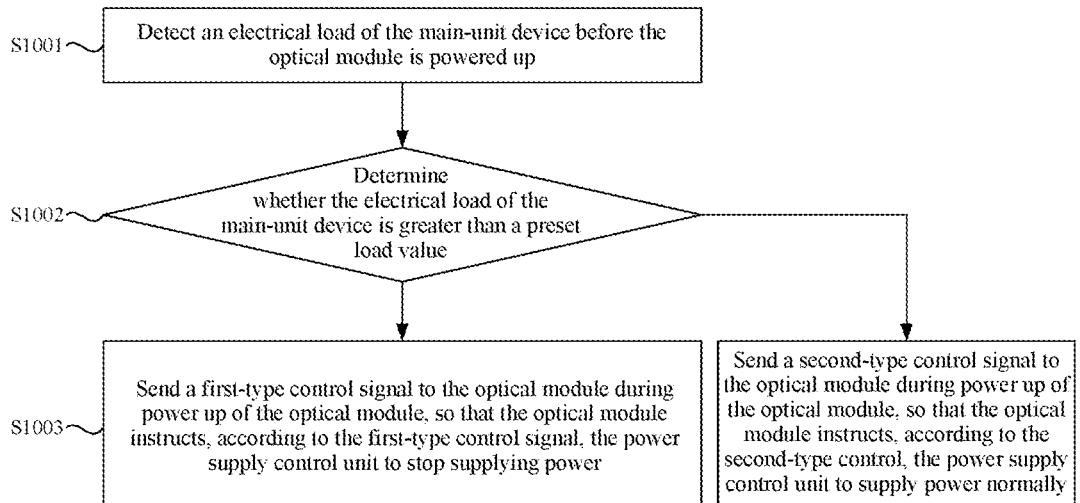
FIG. 10 is a flowchart of a method for controlling an optical module by a main-unit device.

An implementation of the present disclosure further provides a method for controlling an optical module by a main-unit device. The method is applied to an optical module including a power supply control unit. As shown in FIG. 10, the method may include:

S1001: Detect an electrical load of the main-unit device before the optical module is powered up.

S1002: Determine whether the electrical load of the main-unit device is greater than a preset load value, and if yes, the process turns to the step S1003, or otherwise, the process turns to the step S1004.

S1003: Send a first-type control signal to the optical module during power up of the optical module, so that the optical module instructs, according to the first-type control signal, the power supply control unit to stop supplying power.

S1004: Send a second-type control signal to the optical module during power up of the optical module, so that the optical module instructs, according to the second-type control signal, the power supply control unit to supply power normally.

It may be seen according to the foregoing implementation that, before the optical module is powered up, first, an electrical load of the main-unit device is detected, and if the electrical load of the main-unit device is greater than a preset load value, the first-type control signal may be sent to the optical module during power up of the optical module, so that the optical module instructs, according to the first-type control signal, the power supply control unit to stop supplying power. During power up of the optical module, a control signal can be used to instruct the power supply control unit to stop supplying power, and therefore the impact on the power supply of the main-unit device at the instant when the optical module is inserted in the main-unit device can be reduced or avoided.

A person skilled in the art should understand that the embodiments of the present disclosure may be provided as a method, a system, or a computer program product. Therefore, the present disclosure may use a form of a hardware embodiment, a software embodiment, or an embodiment combining software and hardware. In addition, the present disclosure may use a form of a computer program product implemented on one or more types of storage media (including but not limited to a disk memory, a CD-ROM, and an optical memory) including computer readable program codes.

The present disclosure is described with reference to flowcharts and/or block diagrams of the method, device (system), and computer program product in the embodiments of the present disclosure. It should be understood that computer program instructions can implement each process and/or block in the flowcharts and/or block diagrams and a combination of processes and/or blocks in the flowcharts and/or block diagrams. These computer program instructions may be provided to a general-purpose computer, a dedicated computer, an embedded processor, or a processor of another programmable data processing device to generate a machine, so that an apparatus configured to implement functions specified in one or more processes in the flowcharts and/or one or more blocks in the block diagrams is generated by using instructions executed by the general-purpose computer or the processor of another programmable data processing device.

These computer program instructions may also be stored in a non-transitory computer readable memory that can guide a computer or another programmable data processing device to function in a specific manner, e.g., to implements functions specified in one or more processes in the flowcharts and/or one or more blocks in the block diagrams.

These computer instructions may be loaded into a computer or another programmable data processing device, so that a series of operations and steps are performed on the computer or the another programmable device, thereby generating computer-implemented processes. Therefore, the instructions executed on the computer or the another programmable device provide steps for implementing a specific function in one or more processes in the flowcharts and/or in one or more blocks in the block diagrams Although some exemplary implementations of the present disclosure have been described, persons of ordinary skill in the art can make changes and modifications to these embodiments once they understand the basic inventive concept. Therefore, the following claims are intended to be construed as to cover the descried implementations and all changes and modifications falling within the scope of the present disclosure.

A person of ordinary skill in the art can make various modifications and variations to the present disclosure without departing from the spirit and scope of the present disclosure. The present disclosure is intended to cover these modifications and variations provided that they fall within the scope of protection defined by the following claims and their equivalents.

What is claimed is:

1. An optical module comprising a first edge connector pin, a microcontroller unit (MCU), an optical transceiver, and a power supply controller disposed on a circuit board, wherein:
    the optical transceiver comprises an optical transmitter and an optical receiver each drawing power from a main-unit device;
    the MCU is electrically connected to the first edge connector pin and the power supply controller, and is configured to:
        read a control signal sent by the main-unit device via the first edge connector pin to determine a type of the control signal among a predetermined set of types of control signals, wherein the predetermined set of types of control signals represent levels of a total electric load of the optical module by the optical transmitter and optical receiver as measured by the main-unit device;
        generate a first type indication information representing whether the total electric load of the optical module detected by the main-unit device is greater than a first preset load value according to the type of the control signal; and
        send the first type indication information to the power supply controller; and
    the power supply controller is configured to receive the first type indication information sent by the MCU, and supply power to the optical transmitter without supplying power to the optical receiver of the optical transceiver when the first type indication information indicates that the total electric load of the optical module detected by the main-unit device is not greater than the first preset load value;
    the MCU is further configured to read another control signal sent by the main-unit device via the first edge connector pin to generate a second type indication information representing whether a modified electric load at the optical module as detected by the main-unit device, after power is supplied to the optical transmitter, is not greater than a second preset load value, and send the second type indication information to the power supply controller; and
    the power supply controller is further configured to supply power to the optical receiver when the second type indication information indicates that the modified electric load at the optical module as detected by the main-unit device is not greater than the second preset load value.

2. The optical module according to claim 1, wherein the predetermined set of types of control signals are each configured to command the power supply controller to supply or stop supplying power to all or part of the optical transceiver.

3. The optical module according to claim 1, wherein the power supply controller is further configured to:
    when the first type indication information indicates that the total electric load of the optical module detected by the main-unit device is greater than a third preset load value, stop supplying power to the optical transceiver; and
    when the first type indication information indicates that the total electric load of the optical module detected by the main-unit device is not greater than the third preset load value, supply power to the optical transceiver.

4. The optical module according to claim 1, wherein the power supply controller is further configured to:

when the first type indication information indicates that the total electric load of the optical module detected by the main-unit device is greater than a third preset load value, stop powering up the optical transceiver; and when the first type indication information indicates that the total electric load of the optical module detected by the main-unit device is not greater than the third preset load value, continue powering up the optical transceiver.

5. The optical module according to claim 1, wherein the power supply controller is configured to, when the first type indication information indicates that the total electric load of the optical module detected by the main-unit device is greater than a third preset load value, stop supplying power to the optical receiver or the optical transmitter.

6. The optical module according to claim 1, wherein the optical transmitter comprises a laser driver and a laser and the optical receiver comprises a limiting amplifier and a trans-impedance amplifier.

7. The optical module according to claim 6, wherein the power supply controller is configured to supply power to the optical transceiver when the total electric load of the optical module detected by the main-unit device is not greater than a third preset load value and to stop supplying power to the laser driver and laser of the optical transceiver when the total electric load of the optical module detected by the main-unit device is greater than the third preset load value.

8. The optical module according to claim 1, where the first preset load value and the second preset load value are identical.

9. The optical module according to claim 1, wherein the optical module is connected to the main-unit device in a pluggable manner.

* * * * *